(12) United States Patent
Murray

(10) Patent No.: US 11,557,998 B2
(45) Date of Patent: Jan. 17, 2023

(54) OPEN LOOP DUTY CONTROL WITH AUTOMATIC FIELD ORIENTATION FOR A PERMANENT MAGNET AC (PMAC) MOTOR

(71) Applicant: Infineon Technologies Austria AG, Villach (AT)

(72) Inventor: Brendan Aengus Murray, Los Angeles, CA (US)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 17/229,232

(22) Filed: Apr. 13, 2021

(65) Prior Publication Data
US 2022/0329186 A1 Oct. 13, 2022

(51) Int. Cl.
| | |
|---|---|
| H02P 21/22 | (2016.01) |
| H02P 27/08 | (2006.01) |
| H02P 21/18 | (2016.01) |
| H02P 21/00 | (2016.01) |
| H02P 21/14 | (2016.01) |
| G01R 19/165 | (2006.01) |

(52) U.S. Cl.
CPC ........ *H02P 21/22* (2016.02); *G01R 19/16538* (2013.01); *H02P 21/0003* (2013.01); *H02P 21/141* (2013.01); *H02P 21/18* (2016.02); *H02P 27/08* (2013.01)

(58) Field of Classification Search
CPC .... H02P 21/22; H02P 21/0003; H02P 21/141; H02P 21/18; H02P 27/08; H02P 21/0089; H02P 2203/09; H02P 25/145; G01R 19/16538
See application file for complete search history.

(56) References Cited

U.S. PATENT DOCUMENTS

| | | | | |
|---|---|---|---|---|
| 6,822,416 B1 * | 11/2004 | Kunz | .................... | H02H 7/093 318/722 |
| 6,965,212 B1 * | 11/2005 | Wang | ..................... | H02P 21/06 318/700 |
| 10,673,365 B2 * | 6/2020 | Yu | .......................... | H02P 21/00 |

(Continued)

FOREIGN PATENT DOCUMENTS

CN 104682811 A * 6/2015 .......... H02P 21/0021

*Primary Examiner* — Bickey Dhakal
(74) *Attorney, Agent, or Firm* — Harrity & Harrity, LLP

(57) ABSTRACT

A motor controller configured to drive a permanent magnet synchronous motor (PMSM) with Field Oriented Control (FOC), includes a current controller configured to generate control signals for driving the PMSM. The current controller is configured to measure current information of the PMSM, including a direct-axis motor current and a quadrature-axis motor current. The current controller includes a direct-axis current regulator configured to receive a direct-axis reference current and the direct-axis motor current to generate a direct-axis error value based on a difference between the direct-axis reference current and the direct-axis motor current. The current controller includes a voltage regulator configured to regulate a DQ voltage vector comprising a direct-axis motor voltage and a quadrature-axis motor voltage, wherein the voltage regulator generates the direct-axis motor voltage based on the direct-axis error value and a voltage vector limiting function to drive the direct-axis motor current to zero.

24 Claims, 3 Drawing Sheets

(56) References Cited

U.S. PATENT DOCUMENTS

2014/0210387 A1* 7/2014 Zhao ..................... H02P 21/18
  318/400.02
2018/0131305 A1* 5/2018 Wang ..................... H02P 6/04

* cited by examiner

OPEN LOOP DUTY CONTROL WITH AUTOMATIC FIELD ORIENTATION FOR A PERMANENT MAGNET AC (PMAC) MOTOR

BACKGROUND

Motor drives use switching power inverters to generate variable frequency AC voltages to control the speed of AC motors in domestic, commercial and industrial applications. Permanent magnet alternating current (PMAC) motors generally provide higher power to weight and efficiency than induction motors and are widely used in applications that demand a high dynamic response and/or a very high system efficiency. Stable operation of PMAC motors requires the magnitude and frequency of the applied voltages be scaled and synchronized with the motor rotational frequency.

Field Oriented Control (FOC) is one way to achieve a high efficiency in PMAC motors while the other method is open loop duty control with rotor position sensing feedback from devices such as Hall sensors. However, both control schemes have limitations and unique issues.

The FOC method requires high fidelity current sensing. This is particularly challenging in low-speed operating conditions because the controller has to alter/modify the PWM pulse width in order to open the current sampling window. This leads to higher acoustic noise and current waveform distortion.

On the other hand, the open loop duty control with Hall sensors lacks an optimal efficiency in a high speed operation region due to the fact that phase angle advancement of the applied voltage is required over the phase current. Without angle advance the motor power factor decreases as frequency rises and the motor is driven less efficiently. An external angle advance may be used but the optimal advance function to maximize efficiency varies with motor parameters and load and so must be customized for each application use case. For example, a lookup table is used in some cases to look up the angle advance to be applied relative to the load. As application and load changes, even during runtime, the lookup table needs to be consulted in order to adjust the angle advance.

Certain applications, such as silent and low vibration fans, require both high efficiency and low noise current (i.e., high fidelity current), and neither of the FOC control nor the open loop duty control with Hall sensors can satisfy both of these requirements.

Therefore, an improved motor controller capable of providing high efficiency and high fidelity current may be desirable.

SUMMARY

One or more embodiments provide a motor controller configured to configured to drive a permanent magnet synchronous motor (PMSM) with Field Oriented Control (FOC). The motor controller includes a current controller configured to generate control signals for driving the PMSM, wherein the current controller is configured to measure current information of the PMSM, including a direct-axis motor current and a quadrature-axis motor current. The current controller includes a direct-axis current regulator configured to receive a direct-axis reference current and the direct-axis motor current to generate a direct-axis error value based on a difference between the direct-axis reference current and the direct-axis motor current. The current controller includes a voltage regulator configured to regulate a DQ voltage vector comprising a direct-axis motor voltage and a quadrature-axis motor voltage, wherein the voltage regulator generates the direct-axis motor voltage based on the direct-axis error value and a voltage vector limiting function to drive the direct-axis motor current to zero.

A method of driving a permanent magnet synchronous motor (PMSM) with Field Oriented Control (FOC) includes: generating, by a current controller, control signals for driving the PMSM; measuring, by the current controller, current information of the PMSM, including a direct-axis motor current and a quadrature-axis motor current; generating, by a direct-axis current regulator, a direct-axis error value based on a difference between a direct-axis reference current and the direct-axis motor current; and regulating, by a voltage regulator, a DQ voltage vector comprising a direct-axis motor voltage and a quadrature-axis motor voltage, including generating the direct-axis motor voltage based on the direct-axis error value and a voltage vector limiting function to drive the direct-axis motor current to zero.

BRIEF DESCRIPTION OF THE DRAWINGS

Embodiments are described herein making reference to the appended drawings.

DETAILED DESCRIPTION

Figure 1A:
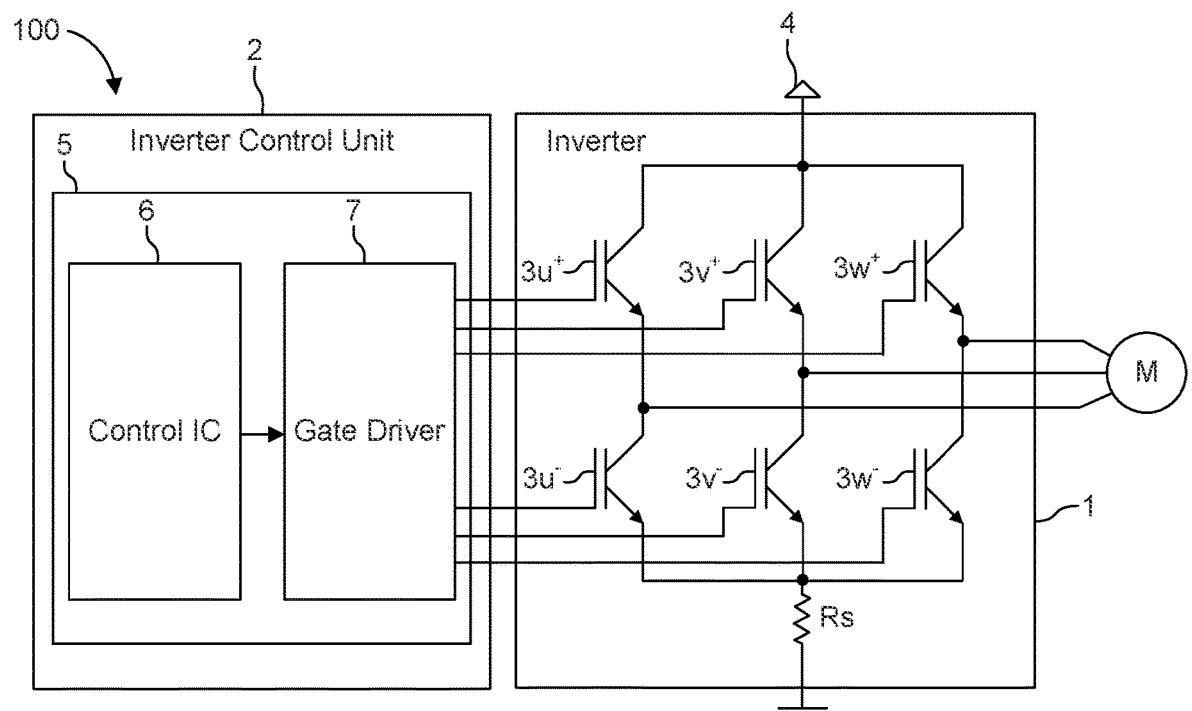
FIG. 1A is a schematic block diagram illustrating a motor control actuator of a power semiconductor device according to one or more embodiments.

In the following, details are set forth to provide a more thorough explanation of the exemplary embodiments. However, it will be apparent to those skilled in the art that embodiments may be practiced without these specific details. In other instances, well-known structures and devices are shown in block diagram form or in a schematic view rather than in detail in order to avoid obscuring the embodiments. In addition, features of the different embodiments described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

In this regard, directional terminology, such as "top", "bottom", "below", "above", "front", "behind", "back", "leading", "trailing", etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope defined by the claims. The following detailed description, therefore, is not to be taken in a limiting sense.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

The terms "substantially" and "approximately" may be used herein to account for small manufacturing tolerances (e.g., within 5%) that are deemed acceptable in the industry without departing from the aspects of the embodiments described herein. For example, a resistor with an approximate resistance value may practically have a resistance within 5% of that approximate resistance value.

In the present disclosure, expressions including ordinal numbers, such as "first", "second", and/or the like, may modify various elements. However, such elements are not limited by the above expressions. For example, the above expressions do not limit the sequence and/or importance of the elements. The above expressions are used merely for the purpose of distinguishing an element from the other elements. For example, a first box and a second box indicate different boxes, although both are boxes. For further example, a first element could be termed a second element, and similarly, a second element could also be termed a first element without departing from the scope of the present disclosure.

A sensor may refer to a component which converts a physical quantity to be measured to an electric signal, for example, a current signal or a voltage signal. The physical quantity may, for example, be a current or a voltage at a shunt resistor in a single-shunt resistor system.

A signal processing circuit and/or a signal conditioning circuit may receive one or more signals from one or more components and perform signal conditioning or processing thereon. Signal conditioning, as used herein, refers to manipulating a signal in such a way that the signal meets the requirements of a next stage for further processing. Signal conditioning may include converting from analog to digital (e.g., via an analog-to-digital converter), amplification, filtering, converting, biasing, range matching, isolation and any other processes required to make a signal suitable for processing after conditioning.

Thus, a signal processing circuit may include an analog-to-digital converter (ADC) that converts the analog signal from the one or more sensor elements to a digital signal. The signal processing circuit may also include a digital signal processor (DSP) that performs some processing on the digital signal.

Many functions of modern devices in automotive, consumer and industrial applications, such as converting electrical energy and driving an electric motor or an electric machine, rely on power semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor structure configured to conduct a load current along a load current path between two load terminal structures of the device. Further, the load current path may be controlled by means of a control electrode, sometimes referred to as a gate electrode. For example, upon receiving a corresponding control signal from, e.g., a driver unit, the control electrode may set the power semiconductor device in one of a conducting state and a blocking state. A control signal may by a voltage signal or a current signal having a controlled value.

A power transistor is a power semiconductor device that may be used to drive a load current. For example, an IGBT is turned "ON" or "OFF" by activating and deactivating its gate terminal. Applying a positive input voltage signal across the gate and the emitter will keep the device in its "ON" state, while making the input gate signal zero or slightly negative will cause it to turn "OFF". There is a turn-on process and a turn-off process for switching the power transistor on and off. During the turn-on process, a gate driver integrated circuit (IC) may be used to provide (source) a gate current (i.e., an on current) to the gate of the power transistor in order to charge the gate to a sufficient voltage to turn on the device. In contrast, during the turn-off process, the gate driver IC is used to draw (sink) a gate current (i.e., an off current) from the gate of the power transistor in order to discharge the gate sufficiently to turn off the device. A current pulse may be output from the gate driver IC as the control signal according to a pulse width modulation (PWM) scheme. Thus, the control signal may be switched between an ON current level and an OFF current level during a PWM cycle for controlling a power transistor. This in turn charges and discharges the gate voltage to turn on and off the power transistor, respectively.

In particular, the gate of a power transistor is a capacitive load, and the turn ON current (i.e., gate source current) and the turn OFF current (i.e., gate sink current) are specified as the initial current when a switching event is initiated. During a turn OFF event, after some small amount of time (small compared to the PWM period), the gate current decreases and reaches a zero value when the gate reaches 0V. During a turn ON event, after some small amount of time (small compared to the PWM period), the gate current decreases and reaches a zero value when the gate reaches 15V.

Transistors may include Insulated Gate Bipolar Transistors (IGBTs) and Metal Oxide Semiconductor Field Effect Transistors (MOSFETs) (e.g., Si MOSFETs or SiC MOSFETs). While IGBTs may be used as an example in the embodiments below, it will be appreciated that MOSFETs may be substituted for the IGBTs and vice versa. In this context, when substituting a MOSFET for an IGBT, a MOSFET's drain may be substituted for an IGBT's collector, the MOSFET's source may be substituted for the IGBT's emitter, and the MOSFETs drain-source voltage $V_{DS}$ may be substituted for the IGBT's collector-emitter voltage $V_{CE}$ in any one of the examples described herein. Thus, any IGBT module may be substituted by a MOSFET module and vice versa.

Specific embodiments described in this specification pertain to, without being limited thereto, a power semiconductor device that may be used within a power converter or a power supply. Thus, in an embodiment, the power semiconductor device may be configured to carry a load current that is to be supplied to a load and/or, respectively, that is provided by a power source. For example, the semiconductor device may comprise one or more power semiconductor cells, such as a monolithically integrated diode cell, and/or a monolithically integrated transistor cell. Such diode cell and/or such transistor cells may be integrated in a power semiconductor module.

Power semiconductor devices that include transistors which are suitably connected to form half-bridges are commonly used in the field of power electronics. For example, half-bridges may be used for driving electric motors or switched mode power supplies.

For example, a multi-phase inverter is configured to provide multi-phase power by supplying multiple phase loads (e.g., a three-phase motor). For instance, three-phase power involves three symmetrical sine waves that are 120 electrical degrees out of phase with one another. In a symmetric three-phase power supply system, three conductors each carry an alternating current (AC) of the same frequency and voltage amplitude relative to a common reference but with a phase difference of one third the period. Due to the phase difference, the voltage on any conductor reaches its peak at one third of a cycle after one of the other conductors and one third of a cycle before the remaining conductor. This phase delay gives constant power transfer to a balanced linear load. It also makes it possible to produce a rotating magnetic field in an electric motor.

In a three-phase system feeding a balanced and linear load, the sum of the instantaneous currents of the three conductors is zero. In other words, the current in each conductor is equal in magnitude to the sum of the currents in the other two, but with the opposite sign. The return path for the current in any phase conductor is the other two phase conductors. The instantaneous currents result in a current space vector.

A three-phase inverter includes three inverter legs, one for each of the three phases, and each inverter leg is connected to a direct current (DC) voltage source in parallel to each other. Each inverter leg includes a pair of transistors, for example, arranged in a half-bridge configuration for converting DC to AC. In other words, each inverter leg includes two complementary transistors (i.e., a high-side transistor and a low-side transistor) connected in series and which switch on and off complementary to the each other for driving a phase load. However, multi-phase inverters are not limited to three phases, and may include two phases or more than three phases, with an inverter leg for each phase.

FIG. 1A is a schematic block diagram illustrating a motor control actuator 100 of a power semiconductor device according to one or more embodiments. In particular, the motor control actuator 100 includes a power inverter 1 and an inverter control unit 2. The inverter control unit 2 behaves as a motor control unit and thus may also be referred to as a motor controller or a motor control IC. The motor control unit may be a monolithic IC or may be split into a microcontroller and a gate driver on two or more ICs.

The motor control actuator 100 is further coupled to a three-phase motor M (e.g., a permanent magnet synchronous motor (PMSM) as a type of AC motor), that includes three phases U, V, and W. The power inverter 1 is a three-phase voltage generator configured to provide three-phase power by supplying three phase voltages to drive the motor M. It will be further appreciated that the power inverter 1 and the inverter control unit 2 may be placed on a same circuit board, or on separate circuit boards.

Deviations in both magnitude and phase may cause a loss in power and torque in the motor M. Therefore, the motor control actuator 100 may be configured to monitor and control the magnitude and phase of the voltages supplied to the motor M in real-time to ensure the proper current balance is maintained based on a feedback control loop. Open loop motor control units also exist and may be implemented.

The power inverter 1 for a three-phase motor M includes a switching array of six transistor modules 3$u$+, 3$u$−, 3$v$+, 3$v$−, 3$w$+, and 3$w$−(collectively referred to as transistor modules 3) arranged in complementary pairs. Each complementary pair constitutes one inverter leg that supplies a phase voltage to the three-phase motor M. Thus, each inverter leg includes an upper (high-side) transistor module 3 and a lower (low-side) transistor module 3. Each transistor module may include one power transistor and may also include a diode (not illustrated). Thus, each inverter leg includes an upper transistor and a lower transistor. Load current paths U, V, and W extend from an output of each inverter leg (i.e., the output of each half-bridge) located between complementary transistors and are configured to be coupled to a load, such as motor M. The power inverter 1 is coupled to a DC power supply 4 (e.g., a battery or a diode bridge rectifier) and to the inverter control unit 2.

In this example, the inverter control unit 2 includes a motor control circuit and the gate driver circuit for controlling the switching array. In some examples, the inverter control unit 2 may be monolithic in which the motor control circuit and gate driver circuit are integrated onto a single die. In other examples, the motor control circuit and gate driver circuit may be partitioned as separate ICs. A "monolithic" gate driver is a gate driver on a single silicon chip and may be further made with specific high voltage (HV) technology. Furthermore, the gate driver IC may be integrated on the power inverter 1.

The motor controller performs the motor control function of the motor control actuator 100 in real-time and transmits PWM control signals to a gate driver. For example, the inverter control unit 2 includes a controller and driver unit 5 that includes a microcontroller unit (MCU) 6 as the motor controller and a gate driver 7 for generating driver signals for controlling the transistors of each transistor module 3. Thus, load current paths U, V, and W may be controlled by the controller and driver unit 5 by means of controlling the control electrodes (i.e., gate electrodes) of the transistors 3. For example, upon receiving a PWM control signal from the microcontroller, the gate driver IC may set a corresponding transistor in one of a conducting state (i.e., on-state) or a blocking state (i.e., off-state).

The gate driver IC may be configured to receive instructions, including the power transistor control signals, from the microcontroller, and turn on or turn off respective transistors 3 in accordance with the received instructions and control signals. For example, during the turn-on process of a respective transistor 3, the gate driver IC may be used to provide (source) a gate current to the gate of the respective transistor 3 in order to charge the gate. In contrast, during the turn-off process, the gate driver IC may be used to draw (sink) a gate current from the gate of the transistor 3 in order to discharge the gate.

The inverter control unit 2 or the controller and driver unit 5 itself may include a PWM controller, an ADC, a DSP, and/or a clock source (i.e., a timer or counter) used in implementing a PWM scheme for controlling the states of each transistor, and, ultimately, each phase current provided on the respective load current paths U, V, and W.

In particular, the microcontroller 6 of the controller and driver unit 5 may use a motor control algorithm, such as a Field Oriented Control (FOC) algorithm, for providing current control in real-time for each phase current output to a multi-phase load, such a multi-phase motor. Thus, the field-oriented control loop may be referred to as a current control loop. Motor speed may further be controlled by adding a speed constant control loop on top of FOC control that provides speed constant control. Thus, FOC (i.e., the current control loop) may be considered as an inner control loop and a speed constant control loop may be considered as an outer control loop. In addition, motor power, and consequently motor speed, may be further controlled by a power constant control loop on top of the speed constant control loop. Thus, the power constant control loop may be considered the outermost control loop, at least with respect to the current control loop and the speed constant control loop. In other words, the current control loop may be considered as an inner control loop, a speed constant control loop may be considered as an intermediate control loop, and a power constant control loop may be considered as an outer control loop.

In some cases, the motor position may be controlled using a fourth control loop (e.g., a position control loop) that is also outside of the speed constant control loop.

For example, during FOC, a motor phase current should be measured such that an exact rotor position can be determined in real-time. To implement the determination of the motor phase current, the microcontroller 6 may employ an algorithm (e.g., space vector modulation (SVM), also referred as space vector pulse width modulation (SVPWM)) that uses single-shunt current sensing.

Furthermore, the switches 3 (i.e., transistors) of the power inverter 1 are controlled so that at no time are both switches in the same inverter leg turned on or else the DC supply would be shorted. This requirement may be met by the complementary operation of the switches 3 within an inverter leg according to the motor control algorithm.

Figure 1B:
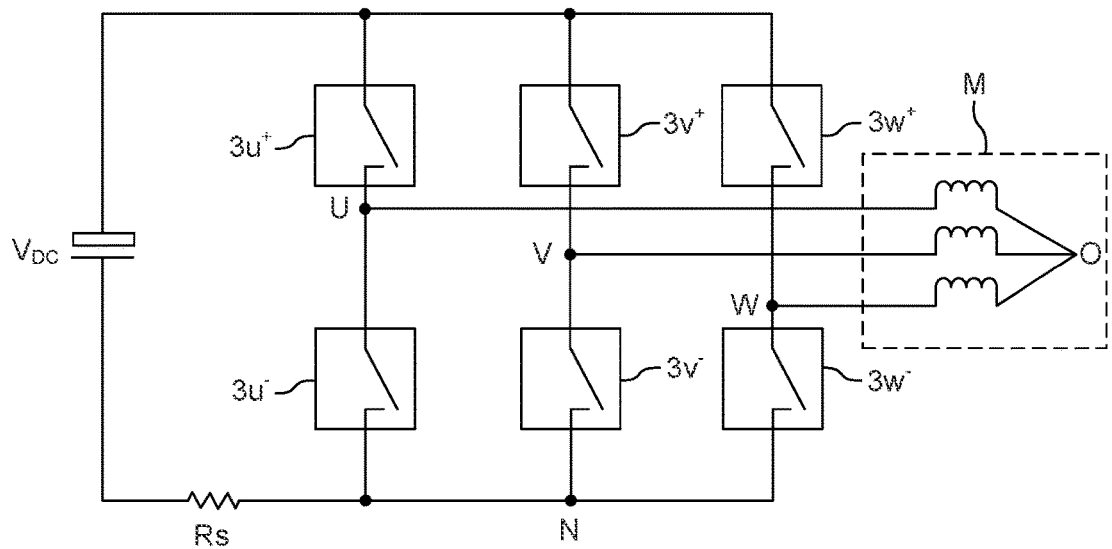
FIG. 1B is a schematic diagram illustrating a power inverter utilizing single-shunt current sensing according to one or more embodiments.

FIG. 1B is a schematic diagram illustrating a power inverter 1 utilizing single-shunt current sensing according to one or more embodiments. In particular, the power inverter 1 includes a shunt resistor Rs placed on the negative DC link (bus) of the power inverter 1. The transistors $3_{u+}$, $3_{u-}$, $3_{v+}$, $3_{v-}$, $3_{w+}$, and $3_{w-}$ are represented as switches and the motor M is shown with a winding for each of its phases. Here, UO represents the line to neutral voltage from bridge middle point U to motor neutral point O; UN represents the U bridge voltage from bridge middle point U to the negative bus supply rail N; UV represents the line to line voltage from U phase to V phase; VW represents the line to line voltage from V phase to W phase; and WV represents the line to line voltage from W phase to V phase.

The microcontroller 6 in FIG. 1A may receive samples of the current taken from the shunt resistor Rs and then use an algorithm (i.e., software) to re-construct the three-phase current in real-time. For example, SVPWM is a vector control based algorithm that requires the sensing of the three motor phase currents. By using the single-shunt resistor Rs, DC-link current pulses are sampled at exactly timed intervals. A voltage drop on the shunt resistor Rs may be amplified by an operational amplifier inside inverter control unit 2 and shifted up, for example, by 1.65V. The resultant voltage may be converted by an ADC inside inverter control unit 2. Based on the actual combination of switches, the three-phase currents of the motor M are reconstructed using the SVPWM algorithm. The ADC may measure the DC-link current during the active vectors of the PWM cycle. In each sector, two phase current measurements are available. The calculation of the third phase current value is possible because the three winding currents sum to zero.

SVPWM itself is an algorithm for the control of PWM in real-time. It is used for the creation of AC waveforms, and may be used to drive three-phase AC powered motors at varying speeds from a DC source using multiple switching transistors. While the examples herein are described in the context of three-phase motors, the examples are not limited thereto and may be applied to any load scheme.

Figure 2:
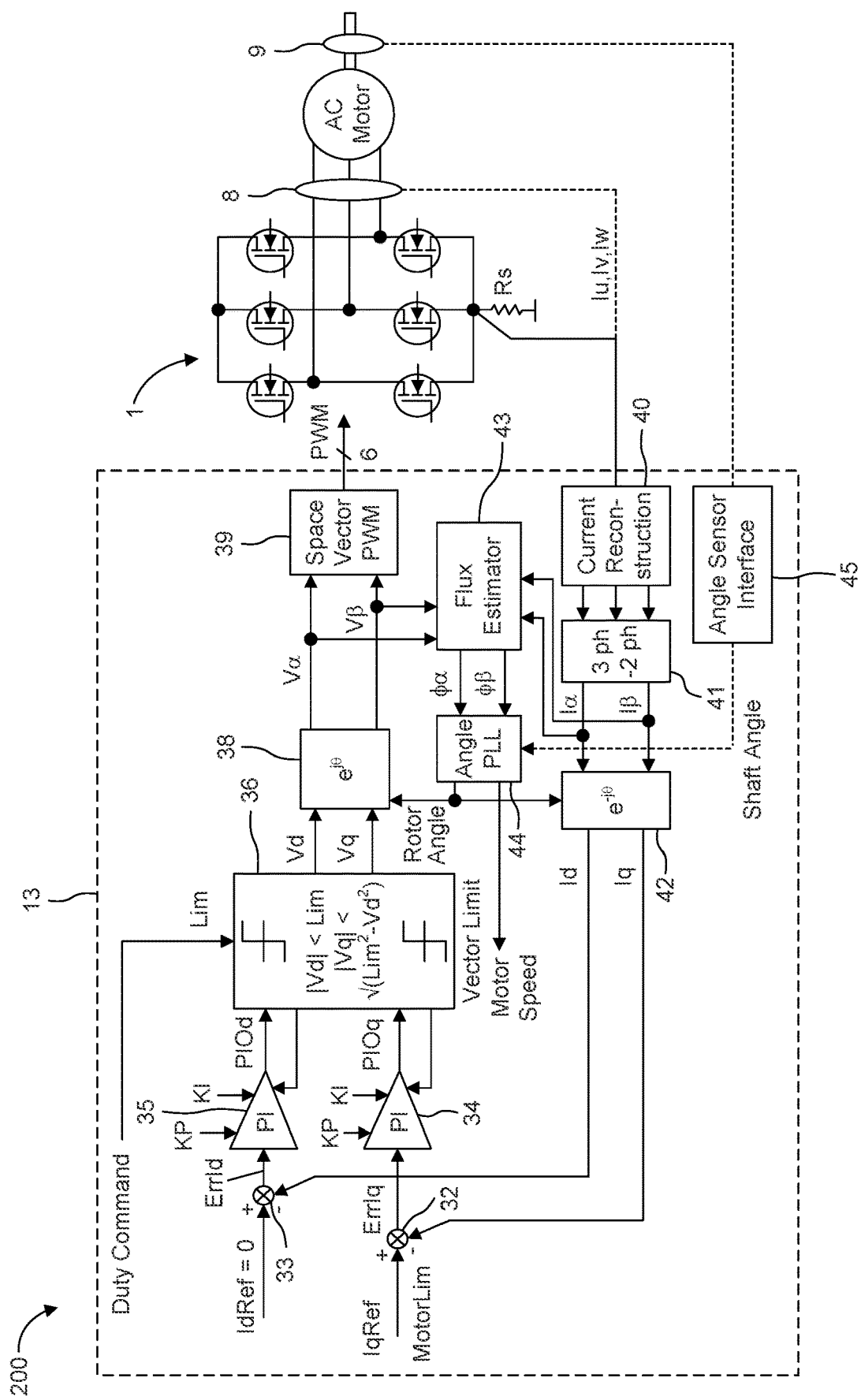
FIG. 2 illustrate a schematic block diagram of a motor drive system according to one or more embodiments.

In addition, it will be appreciated that other implementations other than a single-shunt resistor may be used for current sensing, as well as other motor control algorithms may be used to control the load, and that the embodiments described herein are not limited thereto. For example, a Hall sensor may be used instead of a shunt resistor for current sensing. Alternatively, a current sensor, such as a Hall sensor or shunt resistor, could be placed along each of the load current paths U, V, and W and the currents could be measured directly therefrom. FIG. 2 shows current sensors 8 placed along the load current paths U, V, and W for measuring the load currents.

The core motor drive function is to maintain a target motor angle, speed, or torque within specified performance targets. The various control algorithms derive from the motor model as a set of variable frequency AC sources that convert electrical energy in the stator circuit into mechanical energy on the shaft. The interaction between the stator winding currents on the load current paths U, V, and W and the shaft mounted rotor magnets generates mechanical torque that causes the motor shaft to rotate. The motion of rotor magnets changes the flux linked by the stator windings and generates voltages with a frequency and phase as a function of the magnet angular position.

The motor operates at maximum efficiency when the stator magnetizing field is in quadrature with the rotor magnet field. The maximum efficiency point is where the stator direct (D) axis current is zero and the quadrature (Q) axis current is in phase with the motor back electromotive force (EMF). At this point, the stator voltage vector leads the back EMF vector because of the voltage across the stator magnetizing inductance. To maximize efficiency, the drive system includes a means of adjusting the stator voltage to maintain the stator D and Q currents that generate the required torque to achieve the desired system level control function.

As will be discussed below, embodiments include a voltage regulator (i.e., voltage limiter) that implements a voltage limiting function to allocate available voltage, set by a voltage limit, to the D and Q axes. The voltage regulator performs the allocation such that an angular advance is automatically achieved to optimize efficiency. In particular, the voltage regulator performs the allocation such that the stator direct (D) axis current is zero and the quadrature (Q) axis current is in phase with the motor back EMF. By doing so, the motor controller applies field oriented control principles to automatically advance stator voltage angle to maximize the motor efficiency independent of the motor parameters or load. This means that angular advance is automatically achieved without the need to look up the optimal angular advance function via a lookup table or other means.

FIG. 2 illustrate a schematic block diagram of a motor drive system 200 according to one or more embodiments. In particular, the motor control algorithms described here can be implemented either as software on a programmable motor controller, or as hardware on a configurable or hard coded digital or mixed signal control circuit. For example, a motor control algorithm may be implemented as firmware programmed into the motor controller 6 or by a combination of firmware and circuit components (hardware). The motor drive system 200 includes an inverter 1, a control circuit connected to the input of the inverter 1, and sensor interfaces and a power conversion circuit connected to the AC motor and that integrate with the control circuit. The motor controller 6 itself may include one or more controllers, one or more processing circuits, and/or one or more signal processors that is/are configured to implement the motor control algorithm.

In particular, the motor control algorithm implemented by the motor controller 6 provides open loop duty control with field alignment by way of a current control loop 13. The motor controller 6 is a current controller that implements current control loop 13. The current control loop 13 may be used interchangeably with the current controller.

As used herein, Vq and Vd represent the stator Q and D axis voltages of the motor in a DQ coordinate system, respectively. That is, Vq is the motor voltage component on the Q-axis of a DQ coordinate system and Vd is the motor voltage component on the D-axis of the DQ coordinate system. Similarly, Iq and Id represent the stator Q and D axis currents of the motor in a DQ coordinate system, respectively. That is, Iq is the motor current component on the Q-axis of the DQ coordinate system and Id is the motor current component on the D-axis of the DQ coordinate system. Furthermore, each Proportional-Integral (PI) controller receives a proportional gain KP and an integral gain KI and generates an output according to equations, Eq. 1 and Eq. 2:

$$\text{PI output} = KP\Delta + KI\int \Delta dt, \quad \text{Eq. 1,}$$

where $\Delta$ is the error or deviation of an actual measured value (PV) from a setpoint (SP).

$$\Delta = SP - PV \quad \text{Eq. 2.}$$

Figure 3:
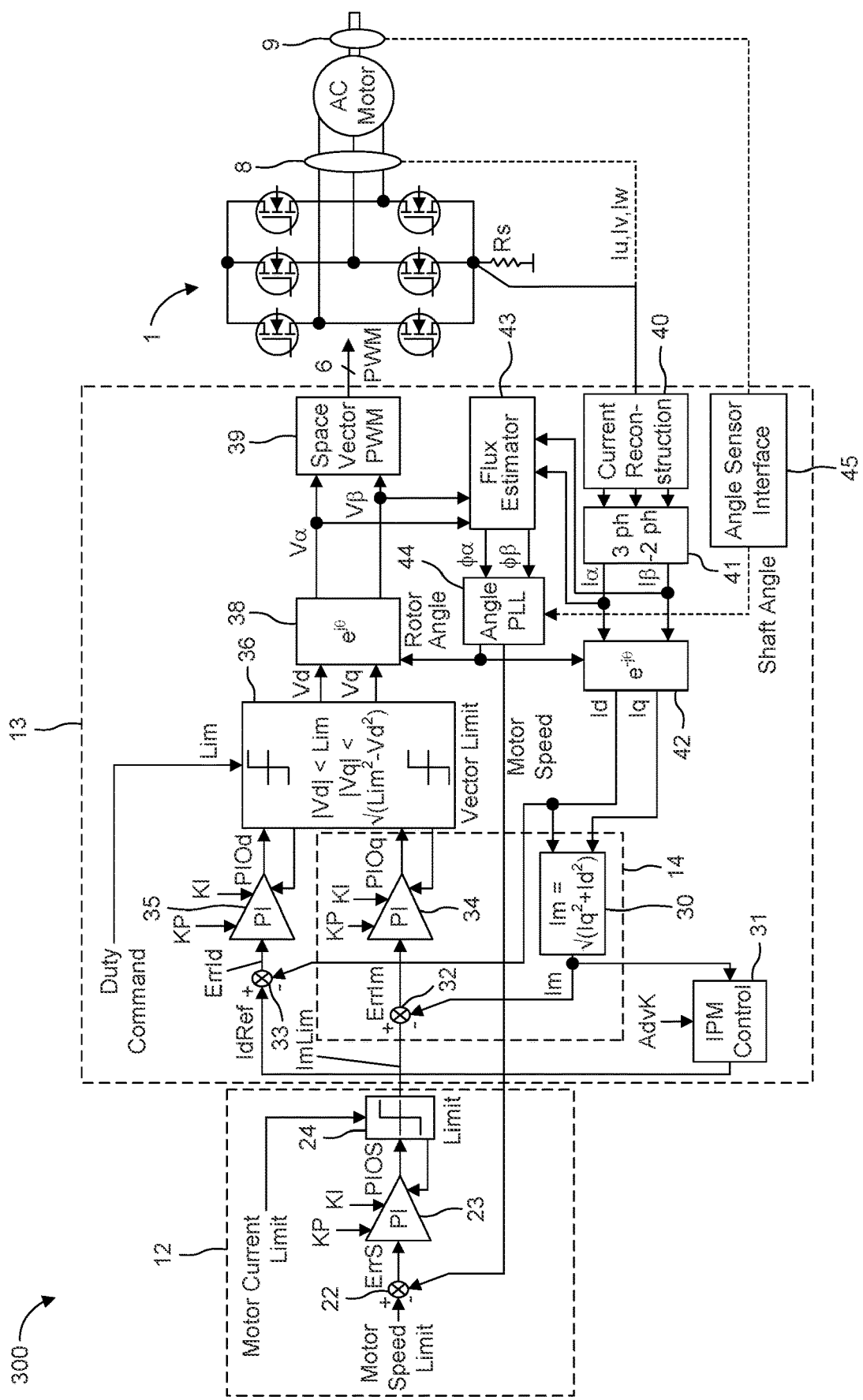
FIG. 3 illustrate a schematic block diagram of an extension of the motor drive system shown in FIG. 2 according to one or more embodiments.

FOC software supports to drive both types of Permanent Magnet Synchronous Motors (PMSM), i.e., constant air-gap surface mount magnet motor and interior mount magnet motors with variable-reluctance. A FOC algorithm structure is illustrated in FIGS. 2 and 3. In FIG. 2, the motor speed can be regulated by adjusting the duty command which sets the limit Lim. FIG. 3 illustrates an FOC algorithm structure provided in a cascaded control structure, with an outer speed control loop and an inner current control loop that each play a role at varying the motor windings voltages to drive the motor at a target power or a target speed. A sensor-based or sensorless FOC algorithm structure may also be used as long as the angle PLL 44 and either the flux estimator 43 or the angle sensor interface 45 are active. The angle PLL unit 43 performs rotor angle and motor speed measurements and estimation based on signals from either the flux estimator 43 or the angle sensor interface 45. The angle sensor interface 45 includes a processor that processes the sensor signals generated by a shaft angle sensor 9. The flux estimator 43 generates angle signals from voltage and current information V$\alpha$, V$\beta$, I$\alpha$ and I$\beta$. The angle PLL unit 44 outputs the estimated rotor angle (Rotor Angle) and the estimated motor speed (Motor Speed).

An Iq reference current IqRef produces torque and Id reference current IdRef is a lagging, reactive current that does not produce any torque. Thus, the current loop of current controller 13 maintains the Id reference current IdRef at zero. IqRef is a current command (i.e., a reference current value) on the Q-axis. In other words, IdRef is a value of a target current (i.e., a reference current value) for an Id current component.

The current Iq loop PI compensator 34, also referred to as an Iq controller 34 acts on the error ErrIq between the IqRef and Iq. The current Iq loop PI compensator 34 generates an output from the time integral of the current error ErrIq plus a proportional output of the current error ErrIq. The integral term forces the steady state error to zero while the proportional term improves the high frequency response. The PI compensator gains KP and KI are adjusted depending on the motor and load characteristics to meet the target dynamic performance. By setting the Iq reference current IqRef to the motor current limit MotorLim (i.e., the maximum current the motor can handle), ErrIq will always have an (non-zero) error as long as Iq is less than the motor limit MotorLim, which drives the output voltage PIOq of the Iq loop PI compensator 34 to Vqmax (i.e., the maximum available voltage after allocating voltage to Vd) until motor current Iq comes up to the motor current limit MotorLim. When the motor current Iq equals the motor current limit MotorLim, the error ErrIq is zero and the output voltage PIOq begins to decrease.

Similarly, the current Id loop PI compensator 35, also referred to as an Id controller 35, acts on error ErrId between the IdRef and the motor current Id to convert the current error ErrId to generate output voltage PIOd. The PI compensator gains KP and KI are also adjusted depending on the motor and load characteristics to meet the target dynamic performance, but generally they are the same as for current Iq loop PI compensator 34.

A voltage limiter (i.e., a voltage regulator) 36 regulates the d axis voltage Vd and the q axis voltage Vq. The voltage limiter 36 is a non-linear element that acts on the PIOd and PIOq voltage outputs. If the output voltage PIOd is less than the limit Lim, the PIOd signal passes through to the Vd output as the d-axis voltage Vd. If the output voltage PIOd exceeds the limit Lim then the Vd output is set to limit value Lim. In this way, the PI compensator 35 generates the output voltage PIOd as a preliminary direct-axis motor voltage that is to be evaluated and regulated by the voltage limiter 36 in accordance with the voltage vector limiting function that uses limit Lim. The voltage limiter 36 outputs the d-axis voltage Vd based on output voltage PIOd, the limit Lim, and the voltage vector limiting function.

As one example, an analog circuit implementation would have a resistor and a diode connected between the limit input and a voltage source. The Vd output is the diode anode-resistor circuit node. If the input (i.e., the output voltage PIOd) is lower than the source voltage, then the diode is reverse biased and the Vd output follows the input (i.e., the output voltage PIOd). If the input (i.e., the output voltage PIOd) is higher than the source voltage then the diode will conduct and the Vd output will be held to a diode drop above the source voltage. The mathematical behavior is output=minimum(Lim,input).

Similarly, the PI compensator 34 generates the output voltage PIOq as a preliminary q-axis motor voltage that is to be evaluated and regulated by the voltage limiter 36 in accordance with the voltage vector limiting function that uses limit Lim. The voltage limiter 36 outputs the q-axis voltage Vq output based on output voltage PIOq, the limit Lim, and the voltage vector limiting function.

Together, elements 33, 35, and 36 form a current regulator that monitors and regulates motor current Id and regulates the d-axis voltage Vd and the q-axis voltage Vq according to the desired motor current Id.

The voltage limiter 36 receives a duty command (e.g., a duty cycle) that sets a voltage limit Lim and maintains inverter output voltages based on this voltage limit Lim. The voltage limiter 36 also receives the outputs of the Iq controller 34 and the Id controller 35, respectively, and regulates the current loop output voltages Vd and Vq based on the voltage limit Lim and a voltage vector limiting function, according to equations Eq. 3, Eq. 4, Eq. 5, and Eq. 6:

$$|Vd| < Lim \qquad \text{Eq. 3,}$$

$$\operatorname{sqrt}(Lim^2 - Vd^2) \qquad \text{Eq. 4,}$$

$$Vd^2 + Vq^2 < Lim^2 \qquad \text{Eq. 5.}$$

$$Vd^2 + Vq^2 = Lim^2 \text{ if } |Vq| > \operatorname{sqrt}(Lim^2 - Vd^2) \qquad \text{Eq. 6.}$$

The duty command adjusts the voltage limit Lim used by the voltage regulator 36. The voltage limit Lim is the total amount of voltage that is available to be allocated by the voltage regulator 36 to the output voltages Vd and Vq. By adjusting the duty command, the total amount of voltage that can be allocated is adjusted. Equation 5 is the general form when both Id and Iq are being regulated and the DQ voltage vector (i.e., the Vd, Vq voltage vector) is within the inverter voltage limits. Equation 6 applies when the q-axis voltage Vq is greater than the limit.

According to equations Eq. 3 and Eq. 4 of the voltage vector limiting function, the voltage regulator 36 regulates (limits) the current loop output voltages Vd and Vq based on the same limit Lim, where the duty command sets a total voltage amount to be allocated to (output for) by the output voltages Vd and Vq. Here, the voltage regulator 36 first allocates the output voltage Vd a first portion of the total voltage set by Lim sufficient to drive the d motor current Id to zero (up to the voltage limit Lim) and the voltage regulator 36 allocates any remaining portion of the voltage limit Lim to output voltage Vq, where the remaining portion is the square root (sqrt) of $(Lim^2 - Vd^2)$ according to equation Eq. 4.

In other words, output voltage Vd is the dominant vector between the two output voltages Vd and Vq and gets priority over output voltage Vq. As long as Vdext is less than the voltage limit Lim (|Vd|<Lim), some portion of the available voltage limit set by the duty command will be available to be used for output voltage Vq. In this case, the amount of voltage allocated to output voltage Vq is set by equation Eq. 4. On the other hand, if Vdext reaches or exceeds the voltage limit Lim, the first portion is an entire portion and the remaining portion is zero. In other words, no voltage remains for allocation to the output voltage Vq and the voltage regulator sets the output voltage Vq to zero.

Accordingly, the voltage regulator 36 limits the magnitude of the output voltages Vd and Vq based on the total amount of voltage available, set by voltage limit Lim, according to the voltage vector limiting function of equations Eq. 3 and Eq. 4. Prioritizing the output voltage Vd up to the set limit Lim allows the d-axis current Id to be driven and maintained at zero. This automatically sets the current in alignment with the rotor flux, thereby providing an automatic angle advance independent of the motor parameters and load without the need of a lookup table to determine the angle advance relative to a load. In other words, the voltage regulator performs the allocation such that the stator direct (D) axis current Id is zero and the quadrature (Q) axis current Iq is in phase with the motor back EMF such that performs the angular advance automatically based on the voltage vector limiting function.

Thus, as a first feature, the vector limit function limits the d-q axis voltage magnitude with a priority on the d axis voltage Vd over the q axis voltage Vq. The d-axis current regulator adjusts the d axis voltage Vd to maintain the d-axis current Id needed to operate the drive at maximum efficiency and the voltage vector limiting function applies the remaining available voltage to the q axis voltage Vq. Preferably, the voltage vector limiting function maintains the d-axis current Id at zero, which provides an automatic angle advance function. When the duty command sets the vector limit level Lim, then the d and q axes stator voltage magnitudes follow the duty command.

As a second feature, the motor controller 6 may be configured to set the Iq reference current IqRef to the motor current limit MotorLim of the motor to provide additional advantages. In this case, the q axis current regulator has its input at the error generator 32 set to the maximum allowable motor current limit MotorLim. This q axis regulator typically operates in saturation but, if the Iq motor current exceeds the motor current MotorLim, the q axis current regulator adjusts the q axis voltage Vq output at the voltage regulator 36 to keep the motor current Iq within the motor current limit MotorLim.

By setting the Iq reference current IqRef to the motor current limit MotorLim (i.e., the maximum current the motor can handle), ErrIq generated by the error generator 32 will always have an error as long as motor current Iq is less than the motor current limit MotorLim, which drives the output voltage POIq of PI controller 34 to Vqmax (i.e., the maximum available voltage after allocating voltage to voltage Vd). If motor current Iq increases up to motor current limit MotorLim, then error ErrIq becomes zero and the output voltage PIOq begins to decrease. This second feature provides overcurrent protection without distorting the voltage waveform and thus minimizes unwanted noise and vibration.

A forward vector rotation unit 38 applies a forward vector rotation to the current loop output voltages Vd and Vq and transforms the current loop output voltages Vd and Vq into two phase AC voltage components Vα and Vβ based on the rotor angle θ calculated by the flux estimator and PLL unit 43. As a result, the forward vector rotation unit 38 aligns the stator voltage with the motor back EMF using a shaft angle sensor.

A space vector pulse width modulator 39 receives the two phase AC voltage components Vα and Vβ and generates the inverter switching signals (i.e., six paths of PWM control signals output from motor controller 6) based on the Vα and Vβ voltage inputs and SVPWM. The gate driver 7 then turns on/off the respective power transistors 3 based on the PWM control signals.

The duty command is an open loop control, the d-axis current regulator is closed loop control, and the q-axis current regulator is open loop control. The current loops of current controller 13 calculate the inverter voltages to drive the motor currents needed to operate the motor at maximum efficiency. The phase current reconstruction circuit 40 uses single shunt reconstruction to reconstruct each of the phase currents Iu, Iv, and Iw for each respective phase U, V, and W. Alternatively, a current sensor, such as a Hall sensor or shunt resistor, could be placed along each of the load current paths U, V, and W and the currents could be measured directly therefrom and provided to the phase current reconstruction circuit 40.

In particular, using single shunt reconstruction, the phase current reconstruction circuit 40 measures the DC link current in the shunt resistor Rs during the active vectors of the PWM cycle. In each PWM cycle, there are two different active vectors and the DC link current in each active vector represents current on one motor phase. The calculation of the third phase current value is possible because at balanced condition the sum of all the three winding currents is zero.

The Field-oriented control (FOC) uses the Clarke transform at Clarke transformation unit 41 to apply an alpha-beta transformation on the three-phase currents to derive an alpha current Iα and a beta current Iβ. The FOC further uses a vector rotation (i.e., a cordic rotation) at vector rotation unit 42 to transform the motor winding currents using alpha and beta currents Iα and Iβ into two quasi DC current components, an Id current component that reinforces or weakens the rotor field and an Iq current component that generates motor torque.

Two error generators (e.g., subtractors) 32 and 33 generate error values ErrIq and ErrId, respectively. In particular, error generator 32 receives the reference current value IqRef as a setpoint (SP) value and the Iq current value from the vector rotation unit 42 as the actual measured value (PV), and generates error value ErrIq. Similarly, error generator 33 receives a reference current value IdRef (i.e., the reference current value on the D-axis) as a setpoint (SP) value and the Id current value from the vector rotation unit 42 as the actual measured value (PV), and generates error value ErrId. The motor controller 6 sets IdRef equal to zero.

A rotor magnet position estimator includes a flux estimator 43 and an angle PLL 44. The flux estimator 43 and the angle PLL 44 are running in order to detect the rotor position and measure the motor speed of a running motor. Flux is calculated based on feedback current (i.e., using alpha and beta currents Iα and Iβ), estimated voltages Vα and VP (based on DC bus feedback voltage and a modulation index), and motor parameters (inductance and resistance). The output of the flux estimator 43 represents rotor magnet fluxes in Alpha-Beta (stationary orthogonal frame, u-phase aligned with Alpha) two-phase quantities φm and φβ.

The angle PLL 44 estimates the flux angle (i.e., estimated rotor angle) and motor speed from the rotor magnet flux vector in Alpha-Beta components. A vector rotation of the PLL calculates the error between the rotor flux angle and the estimated angle. A PI compensator and integrator of the PLL 44 in the closed loop path force angle and frequency estimate to track the angle and frequency of the rotor flux. The motor speed is derived from the rotor frequency according to the number of rotor poles.

In an alternate implementation, the Angle PLL 43 estimates the flux angle (i.e., estimated rotor angle) and motor speed from signals generated by a shaft angle sensor. An error amplifier of the angle PLL calculates the error between shaft sensor angle and the estimated angle. A PI compensator and integrator of the PLL in the closed loop path force the frequency estimate to track the frequency of the sensor angle. The motor speed is derived from the rotor frequency according to the number of rotor poles.

FIG. 3 illustrates a schematic block diagram of a motor drive system 300 according to one or more embodiments. In particular, the motor drive system 300 is and extension of motor drive system 300 and further includes an extended current control loop 13 and a speed limit loop 12. Thus, the motor controller 6 includes a motor current limiter 14 that performs a motor current limiting function that reduces the motor voltage (DQ voltage) when the DQ motor current vector magnitude Im exceeds the motor current limit (ImLim) input. The motor current limit ImLim is a reference DQ current vector magnitude that is used as the reference current value IqRef. The motor current limit ImLim is introduced because the IPM control function performed by the IPM controller 31 creates a non-zero Id current. As a result, Iq current no longer represents the total motor current as it did in FIG. 2.

A motor current magnitude processor 30 calculates the DQ motor current vector magnitude of the direct and quadrature motor currents Id and Iq as $Im = \sqrt{Id^2 + Iq^2}$. If the DQ motor current vector magnitude Im is less than a reference DQ current vector magnitude ImLim then the Q-axis PI regulator 34 (PI controller) output PIOq will drive the motor voltage (DQ voltage) to the value set by the duty command Lim. If the DQ motor current vector magnitude Im is greater than the reference DQ current vector magnitude ImLim the PI regulator 34 will reduce the motor voltage (DQ voltage) until the DQ current vector magnitude Im is less than or equal to the reference DQ current vector magnitude ImLim.

The PI compensator 34, also referred to as an Im controller 34 in this example, acts on the error ErrIm between ImRef and Im. The motor current magnitude error ErrIm drives the PI regulator 34 so that its output is PIOq. The integral term forces the steady state error to zero while the proportional term improves the high frequency response. The PI compensator gains KP and KI are adjusted depending on the motor and load characteristics to meet the target dynamic performance.

If PIOq exceeds the Q-axis limit voltage ($\sqrt{Lim^2 - Vd^2}$) then the Vq output of the voltage limiter 36 is set to the Q-axis limit and the PIOq voltage at the PI regulator 34 is set to the Q-axis limit. This effectively pauses the integrator of the PI controller 34 while the output PIOq is being limited. This is often described as 'anti-windup'. Then, if ErrIm becomes negative the Vq voltage can be immediately driven in the other direction.

The speed limit control loop 12 provides a speed limit function that reduces the ImLim input to the motor current limiter 14 if the speed exceeds the motor speed limit setting.

The motor speed limit is a constant value. The error generator 22 receives the motor speed limit and an actual (measured) motor speed value MotorSpeed (i.e., estimated motor speed) from the angle PLL 44, and generates a speed error ErrS that is the deviation between the motor speed limit and the actual (estimated) motor speed.

The PI compensator 23 acts on the error ErrS and generates an output voltage PIOS from the time integral of the speed error ErrS plus a proportional output of the speed error ErrIq. When the estimated motor speed is less than the motor speed limit the PIOS output increases until it reaches the motor current limit set at the motor current limiter 24. When the estimated motor speed is greater than the motor speed limit, the output voltage PIOS decreases, thereby causing the motor current limiter output to reduce ImLim until the estimated motor speed falls below the motor speed limit.

The motor current limiter 24 is a limiting function block that applies one or more limiting functions on the output PIOS of PI compensator 23. For example, the motor current limiter 24 performs a motor current limiting function on the output POIS of the PI compensator 23 according to the motor current limit to prevent integral windup and to maintain the motor currents within the maximum current the motor can handle. The motor current limiter 24 can perform a low speed limiting function on the output POIS of the PI compensator 23 to limit the motor current at low speed. The motor current limiter 24 can perform a regeneration current limiting function on the output POIS of the PI compensator 23 to limit the regeneration current of motor.

In this example, the speed limit function includes the PI regulator 23 that increases the ImLim output according to the motor current limit setting as long as the estimated motor speed from the angle PLL 44 is lower than the motor speed limit input to the error generator (subtractor) 22. The motor current limiter 24 will reduce only the motor voltage (DQ voltage) if the motor current exceeds the motor current limit. If the estimated motor speed exceeds the motor speed limit, the PI regulator 23 will reduce the ImRef output. The motor current protection regulator will in turn reduce the motor voltage (DQ voltage) until a new steady state operating point is reached where the estimated motor speed is less than or equal to the motor speed limit. This may be needed when the motor is lightly loaded during factory test.

Two error generators (e.g., subtractors) 32 and 33 generate error values ErrId and ErrIm, respectively. In particular, error generator 32 receives the reference current value ImRef as a setpoint (SP) value from the motor current limiter 24 and the Im current value from motor current magnitude processor 30 as the actual measured value (PV), and generates error value ErrIm. Similarly, error generator 33 receives a reference current value IdRef (i.e., the reference current value on the d axis) from the motor current limiter 24, as a setpoint (SP) value, and the Im current value from the motor current magnitude processor 30 as the actual measured value (PV), and generates error value ErrIm.

The interior permanent magnet (IPM) controller 31 makes the required adjustment to the d-axis reference current IdRef to maximize the motor torque per ampere when there is a difference between the motor Q-axis and D-axis inductances.

The IPM controller 31 calculates a non-zero IdRef based on an angle advance which is a function of the motor parameters and the motor current. The angle advance calculation can be implemented as a linear approximation or as a look up table derived from motor characterization. This function optimizes the motor operating point of the motor for maximum efficiency.

In this example, the IPM controller 31 includes an angle advance function that calculates a current vector angle advance that is proportional to the DQ motor current vector magnitude Im. The angle advance proportional gain AdvK is input to the IMP controller 31 and is determined from the motor flux constant and the difference between the motor d-axis and q-axis winding inductances. The IPM controller 31 calculates the d-axis reference current IdRef that is proportional (i.e., based on the value of the angle advance proportional gain AdvK) to the sine of the angle advance and the motor current. The d-axis current regulator that includes an error amplifier 33 and a PI compensator 35 is configured to adjust the d-axis voltage Vd to maintain the target Id current defined by d-axis reference current IdRef.

While various embodiments have been disclosed, it will be apparent to those skilled in the art that various changes and modifications can be made which will achieve some of the advantages of the concepts disclosed herein without departing from the spirit and scope of the invention. It is to be understood that other embodiments may be utilized and structural or logical changes may be made without departing from the scope of the present invention. It should be mentioned that features explained with reference to a specific figure may be combined with features of other figures, even in those not explicitly mentioned. Such modifications to the general inventive concept are intended to be covered by the appended claims and their legal equivalents.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent on the independent claim.

It is further to be noted that methods disclosed in the specification or in the claims may be implemented by a device having means for performing each of the respective acts of these methods. For example, the techniques described in this disclosure may be implemented, at least in part, in hardware, software, firmware, or any combination thereof, including any combination of a computing system, an integrated circuit, and a computer program on a non-transitory computer-readable recording medium. For example, various aspects of the described techniques may be implemented within one or more processors, including one or more microprocessors, DSPs, ASICs, or any other equivalent integrated or discrete logic circuitry, as well as any combinations of such components.

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some embodiments, a single act may include or may be broken into multiple sub acts. Such sub acts may be included and part of the disclosure of this single act unless explicitly excluded.

What is claimed is:

1. A motor controller configured to drive a permanent magnet synchronous motor (PMSM) with Field Oriented Control (FOC), the motor controller comprising:
    a current controller configured to generate control signals for driving the PMSM, wherein the current controller is configured to measure current information of the PMSM, including a direct-axis motor current and a quadrature-axis motor current,
    wherein the current controller comprises a direct-axis current regulator configured to receive a direct-axis reference current and the direct-axis motor current to generate a direct-axis error value based on a difference between the direct-axis reference current and the direct-axis motor current, and
    wherein the current controller comprises a voltage regulator configured to regulate a DQ voltage vector comprising a direct-axis motor voltage and a quadrature-axis motor voltage,
    wherein the voltage regulator generates the direct-axis motor voltage based on the direct-axis error value and a voltage vector limiting function to drive the direct-axis motor current to zero, wherein the voltage vector limiting function is configured to limit the DQ voltage vector according to a voltage limit such that a sum of the direct-axis motor voltage, squared, and the quadrature-axis motor voltage, squared, is always equal to the voltage limit, squared, wherein the voltage regulator is configured to allocate a first portion of the voltage limit to the direct-axis motor voltage, up to the voltage limit, based on the direct-axis error value, and allocate a remaining portion of the voltage limit to the quadrature-axis motor voltage.

2. The motor controller of claim 1, wherein:

the current controller comprises a quadrature-axis current regulator configured to receive a quadrature-axis reference current and a quadrature-axis motor current to generate a quadrature-axis error value based on a difference between the quadrature-axis reference current and the quadrature-axis motor current, and the voltage regulator is configured to generate the quadrature-axis motor voltage based on the direct-axis error value, the quadrature-axis error value, and the voltage vector limiting function.

3. The motor controller of claim 1, wherein the voltage regulator is configured to prioritize a voltage allocation to the direct-axis motor voltage over the quadrature-axis motor voltage.

4. The motor controller of claim 1, wherein the voltage regulator is configured to receive a duty command having a predetermined duty cycle and set the voltage limit of the DQ voltage vector according to the predetermined duty cycle, wherein the voltage limit is a total amount of voltage available for allocation to a combination of the direct-axis motor voltage and the quadrature-axis motor voltage.

5. The motor controller of claim 1, wherein the remaining portion equals the square root of ($Lim^2-Vd^2$), where Lim denotes the voltage limit and Vd denotes the first portion of the voltage limit allocated to the direct-axis motor voltage.

6. The motor controller of claim 1, wherein the voltage regulator regulates the direct-axis motor voltage and the quadrature-axis motor voltage according to the following equation:

$$Lim^2 = Vd^2 + Vq^2,$$

where Lim denotes the voltage limit, Vd denotes the first portion of the voltage limit allocated to the direct-axis motor voltage, and Vq denotes the remaining portion of the of the voltage limit allocated to the quadrature-axis motor voltage.

7. The motor controller of claim 1, wherein the voltage regulator is configured to allocate the remaining portion of the voltage limit to the quadrature-axis motor voltage subsequent to allocating the first portion of the voltage limit to the direct-axis motor voltage, wherein the remaining portion is equal to or greater than zero up to the voltage limit.

8. The motor controller of claim 4, wherein:

wherein the current controller comprises a quadrature-axis current regulator configured to receive a quadrature-axis reference current and a quadrature-axis motor current to generate a quadrature-axis error value based on a difference between the quadrature-axis reference current and the quadrature-axis motor current, and the current controller is configured to fixedly set the quadrature-axis reference current to a motor current limit to operate the quadrature-axis current regulator in saturation while the quadrature-axis motor current is less than the motor current limit, wherein the motor current limit is a maximum current the PMSM can handle.

9. The motor controller of claim 8, wherein:

the quadrature-axis current regulator is configured to reduce the quadrature-axis motor voltage in response to the quadrature-axis motor current exceeding the motor current limit in order to maintain the quadrature-axis motor current within the motor current limit.

10. The motor controller of claim 1, wherein the voltage regulator drives direct-axis motor current to zero and aligns the quadrature-axis motor current with the motor back electromotive force.

11. The motor controller of claim 1, wherein:

wherein the current controller comprises a quadrature-axis current regulator configured to receive a quadrature-axis reference current and a quadrature-axis motor current to generate a quadrature-axis error value based on a difference between the quadrature-axis reference current and the quadrature-axis motor current, and the current controller is configured to fixedly set the quadrature-axis reference current to a motor current limit to operate the quadrature-axis current regulator in saturation while the quadrature-axis motor current is less than the motor current limit, wherein the motor current limit is a maximum current the PMSM can handle.

12. The motor controller of claim 11, wherein:

the quadrature-axis current regulator is configured to reduce the quadrature-axis motor voltage in response to the quadrature-axis motor current exceeding the motor current limit in order to maintain the quadrature-axis motor current within the motor current limit.

13. The motor controller of claim 1, wherein the current controller is configured to set the direct-axis reference current to zero.

14. The motor controller of claim 1, wherein the remaining portion is greater than zero and equals the square root of (Lim2−Vd2) when the voltage regulator sets the direct-axis motor voltage to be less than the voltage limit, where Lim denotes the voltage limit and Vd denotes the first portion of the voltage limit allocated to the direct-axis motor voltage when the direct-axis motor voltage is less than the voltage limit, and wherein the remaining portion is equal to or greater than zero up to the voltage limit.

15. The motor controller of claim 14, wherein:

the direct-axis current regulator includes a Proportional-Integral (PI) controller configured to receive the direct-axis error value and generate a preliminary direct-axis motor voltage based on the direct-axis error value, and the voltage regulator is configured to receive the preliminary direct-axis motor voltage and apply the voltage vector limiting function to the preliminary direct-axis motor voltage to generate the direct-axis motor voltage, wherein the direct-axis motor voltage is limited to be equal to the voltage limit when the preliminary direct-axis motor voltage is equal to or greater than the voltage limit.

16. The motor controller of claim 15, wherein the voltage regulator is configured to receive a duty command having a predetermined duty cycle and set the voltage limit of the DQ voltage vector according to the predetermined duty cycle, wherein the voltage limit is a total amount of voltage available for allocation to a combination of the direct-axis motor voltage and the quadrature-axis motor voltage.

17. A method of driving a permanent magnet synchronous motor (PMSM) with Field Oriented Control (FOC), the method comprising:
- generating, by a current controller, control signals for driving the PMSM;
- measuring, by the current controller, current information of the PMSM, including a direct-axis motor current and a quadrature-axis motor current;
- generating, by a direct-axis current regulator, a direct-axis error value based on a difference between a direct-axis reference current and the direct-axis motor current;
- regulating, by a voltage regulator, a DQ voltage vector comprising a direct-axis motor voltage and a quadrature-axis motor voltage, including generating the direct-axis motor voltage based on the direct-axis error value and a voltage vector limiting function to drive the direct-axis motor current to zero;
- generating, by a quadrature-axis current regulator, a quadrature-axis error value based on a difference between a quadrature-axis reference current and a quadrature-axis motor current;
- generating, by the voltage regulator, the quadrature-axis motor voltage based on the direct-axis error value, the quadrature-axis error value, and the voltage vector limiting function;
- fixedly setting, by the current controller, the quadrature-axis reference current to a motor current limit to operate the quadrature-axis current regulator in saturation while the quadrature-axis motor current is less than the motor current limit, wherein the motor current limit is a maximum current the PMSM can handle;
- setting, by the current controller, the direct-axis reference current to zero; and
- while the quadrature-axis reference current is fixedly set to the motor current limit and while the direct-axis reference current is set to zero, reducing, by the quadrature-axis current regulator, the quadrature-axis motor voltage in response to the quadrature-axis motor current exceeding the motor current limit in order to maintain the quadrature-axis motor current within the motor current limit.

18. The method of claim 17, wherein regulating the direct-axis motor voltage and the quadrature-axis motor voltage comprises prioritizing a voltage allocation to the direct-axis motor voltage over the quadrature-axis motor voltage.

19. The method of claim 17, wherein regulating the direct-axis motor voltage and the quadrature-axis motor voltage comprises:
- receiving a duty command having a predetermined duty cycle; and
- setting a voltage limit of the DQ voltage vector according to the predetermined duty cycle, wherein the voltage limit is a total amount of voltage available for allocation to a combination of the direct-axis motor voltage and the quadrature-axis motor voltage.

20. The method of claim 19, wherein regulating the DQ voltage vector comprises:
- allocating a first portion of the voltage limit to the direct-axis motor voltage, up to the voltage limit, based on the direct-axis error value; and
- allocating a remaining portion of the voltage limit to the quadrature-axis motor voltage.

21. The method of claim 20, wherein the remaining portion equals the square root of $(Lim^2-Vd^2)$, where Lim denotes the voltage limit and Vd denotes the first portion of the voltage limit allocated to the direct-axis motor voltage.

22. The method of claim 20, wherein the direct-axis motor voltage and the quadrature-axis motor voltage are regulated according to the following equation:

$$Lim^2 = Vd^2 + Vq^2,$$

where Lim denotes the voltage limit, Vd denotes the first portion of the voltage limit allocated to the direct-axis motor voltage, and Vq denotes the remaining portion of the of the voltage limit allocated to the quadrature-axis motor voltage.

23. The method of claim 20, wherein allocating the remaining portion includes allocating the remaining portion of the of the voltage limit to the quadrature-axis motor voltage subsequent to allocating the first portion of the voltage limit to the direct-axis motor voltage, wherein the remaining portion is equal to or greater than zero up to the voltage limit.

24. The method of claim 17, wherein regulating the direct-axis motor voltage and the quadrature-axis motor voltage drives the direct-axis motor current to zero and aligns the quadrature-axis motor current with the motor back electromotive force.

\* \* \* \* \*

UNITED STATES PATENT AND TRADEMARK OFFICE
CERTIFICATE OF CORRECTION

PATENT NO. : 11,557,998 B2
APPLICATION NO. : 17/229232
DATED : January 17, 2023
INVENTOR(S) : Brendan Aengus Murray It is certified that error appears in the above-identified patent and that said Letters Patent is hereby corrected as shown below:

In the Claims

Claim 14:
Column 18, Line 39, change "wherein the remaining portion is greater than zero and" to --wherein the remaining portion equals zero when the voltage regulator sets the direct-axis motor voltage to be equal to the voltage limit, wherein the remaining portion is greater than zero and--

Signed and Sealed this
Twenty-fourth Day of October, 2023

Katherine Kelly Vidal
*Director of the United States Patent and Trademark Office*